United States Patent [19]
Tsubouchi et al.

[11] Patent Number: 5,604,153
[45] Date of Patent: Feb. 18, 1997

[54] PROCESS FOR THIN FILM FORMATION

[76] Inventors: Kazuo Tsubouchi, 30-38, Hitokita 2-chome; Kazuya Masu, 3-1-106, Mikamine 1-chome, both of Taihaku-ku, Sendai-shi, Miyagi-ken, Japan

[21] Appl. No.: 487,580

[22] Filed: Jun. 7, 1995

Related U.S. Application Data

[63] Continuation of Ser. No. 257,948, Jun. 10, 1994, abandoned, which is a continuation of Ser. No. 51,781, Apr. 26, 1993, abandoned.

[30] Foreign Application Priority Data

Apr. 28, 1992 [JP] Japan .................................. 4-136042

[51] Int. Cl.$^6$ ................................................ H01L 21/285
[52] U.S. Cl. ............................................ 437/173; 437/187
[58] Field of Search ...................................... 437/173, 187

[56] References Cited

U.S. PATENT DOCUMENTS

| | | | |
|---|---|---|---|
| 4,460,618 | 7/1984 | Heinecke et al. | 437/173 |
| 5,091,210 | 2/1992 | Mikoshiba et al. | 427/39 |
| 5,179,042 | 1/1993 | Mikoshiba et al. | 437/187 |
| 5,180,687 | 1/1993 | Mikoshiba et al. | 437/187 |
| 5,196,372 | 3/1993 | Mikoshiba et al. | 437/187 |
| 5,208,187 | 5/1993 | Tsubouchi et al. | 437/194 |
| 5,217,756 | 6/1993 | Shinzawa | 437/187 |

FOREIGN PATENT DOCUMENTS 0425084  5/1991  European Pat. Off. .

OTHER PUBLICATIONS

Patent Abstracts of Japan, vol. 14, No. 380 (E-0965), Aug. 16, 1990, & JP-A-02 137 313 (Res. Dev. Corp. of Japan), May 25, 1990.

Applied Physics Letters, vol. 57, No. 12, Sep. 17, 1990, pp. 1221–1223, K. Tsubouchi et al., "Complete Planarization of Via Holes With Aluminum by Selective and Nonselective Chemical Vapor Deposition".

Extended Abstracts of the 1992 International Conference on Solid State Devices & Materials, Aug. 26, 1992, pp. 208–210, K. Tsbouchi et al., "Area Selective Aluminum Patterning by Atomic Hydrogen Resist".

M. Liehr, et al., Extended Abstracts of the 22nd (1990 Intern.) Conf. on Solid State Devices and Materials, Sendai, 1990, pp. 1099–1102.

H. Kawamoto, et al. "Study on Reaction Mechanism of Aluminum Selective Chemical Vapor Deposition with In–situ XPSMeasurement" Japanese Journal of Applied Physics vol. 29, No. 11, Nov. 1990 (pp. 2657–2661).

K. Tsubouchi et al., "Area selective aluminum patterning by atomic hydrogen resist" Extended Abstracts of the 1992 Int. Conf. on Solid State Devices & Materials pp. 208–210 (1992). (abstract only).

*Primary Examiner*—Robert Kunemund
*Attorney, Agent, or Firm*—Fitzpatrick, Cella, Harper & Scinto

[57] ABSTRACT

A process for thin film formation comprises selectively irradiating with an energy ray a substrate to the surface of which a surface treatment for providing hydrogen atoms is applied to thereby form an irradiated region and a non-irradiated region on the surface of the substrate, and forming a thin film selectively on the non-irradiated region.

8 Claims, 5 Drawing Sheets

PROCESS FOR THIN FILM FORMATION

This application is a continuation of application Ser. No. 08/257,948 filed Jun. 10, 1994, now abandoned, which is a continuation of application Ser. No. 08/051,781 filed Apr. 26, 1993, now abandoned.

BACKGROUND OF THE INVENTION

1. Field of the Invention

The present invention relates to a process for thin film formation, particularly to a process for thin film formation which is useful for fine working technique for producing electronic apparatuses such as electronic devices and integrated circuits employing a semiconductor or a thin metal film, and fine mechanisms such as micromachining.

2. Related Background Art

Electronic devices and integrated circuits have attained high performance and high integration degree by extremely fine structure thereof. Today the minimum working dimension is 0.8 µm in commercial 4M bit DRAM. The gate length of 0.07 µm is reported for MOSFET in an experimental model. In a working dimension of 0.1 µm or finer, electron wave interference and tunnel effect become remarkable. Electronic devices based on a new physical phenomenon are expected.

In order to achieve finer structure of electronic devices and integrated circuits, or to realize an electronic device based on a new physical phenomenon, technique for fine working needs to be established which enables stable working in a dimension of 0.1 µm or finer. For the future, required working dimension will be 0.1 µm or finer: for example, working of metal wiring of 100Å wide and 100Å thick at working accuracy of an Å order.

Conventional fine working processes which employ an organic resist film are briefly described with reference to FIGS. 4A to 4D, and the problems in achieving a finer structure are considered.

Figure 4A:
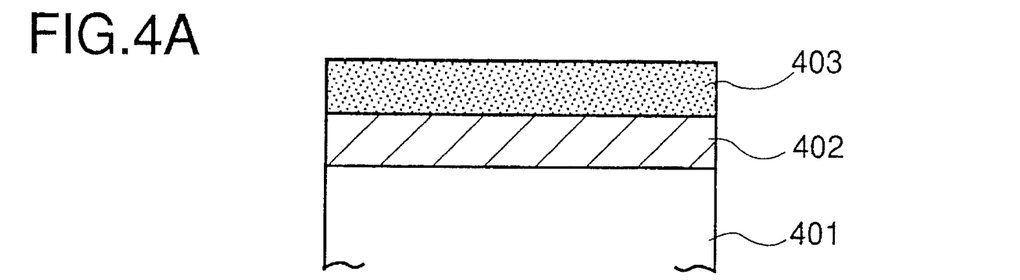
FIGS. 4A to 4D are schematic cross-sectional views of a substrate for explaining conventional lithography steps employing an organic resist.
Figure 4B:
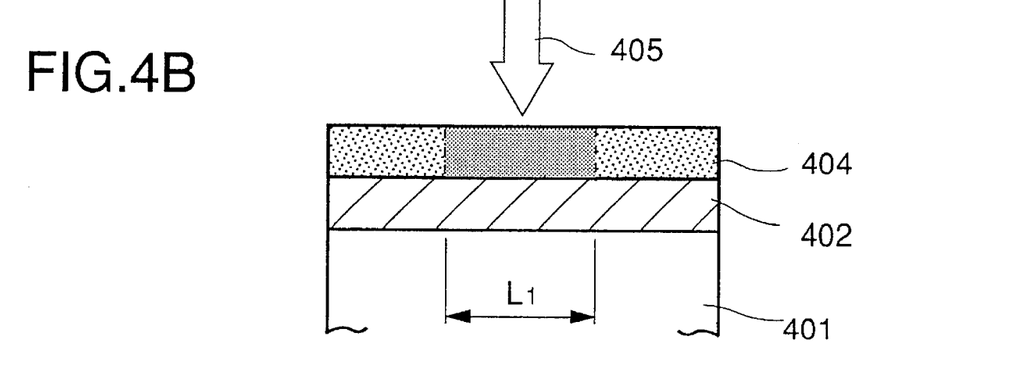
Figure 4C:
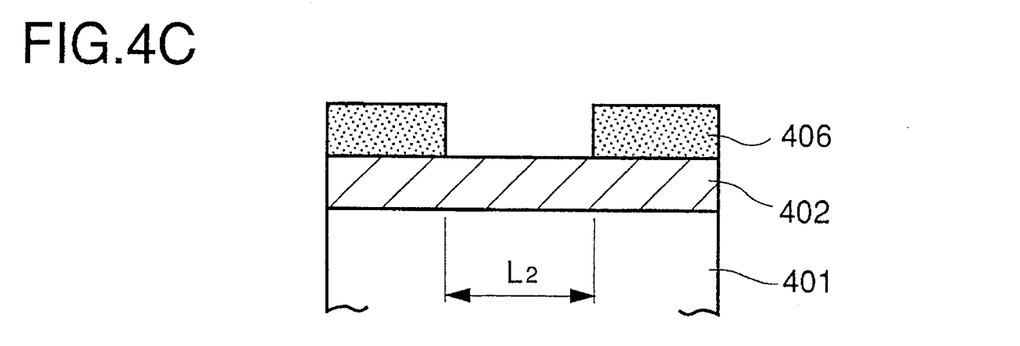

In FIG. 4A, a thin film 402 is formed on a substrate 401. The substrate 401 may be an Si substrate, or an Si wafer with $SiO_2$ formed thereon. The thin film 402 may be a film made of a metal such as Al (aluminum) or the like, or be an insulating film made of BPSG, PSG or the like. The thin film 402 has a thickness ranging from about 0.1 to about 2 µm. An organic resist 403 is applied on the thin film 402 on the substrate 401. As the organic resist 403, well known are AZ1350, PFPR, TSMR, PMMA, and so forth. The thickness of the organic resist 403 ranges from about 0.1 µm to about 2 µm. The plate constructed from the organic resist 403, the thin film 402, and the substrate 401 is irradiated with an energy ray 405 such as an ultraviolet ray and an electron beam as shown in FIG. 4B. By selective exposure of the resist to the energy ray, a resist pattern 404 is formed. The ultraviolet ray or the electron beam is projected in a breadth of $L_1$. The region $L_1$ of the resist irradiated with the light or the electron beam is sensitized, and only the irradiated region of the organic resist is removed by immersion of the resist in a developing solution as shown in FIG. 4C, thereby forming a developed resist, i.e., a resist pattern 406. The above description was made in regard to the case of a positive type resist. In the case of a negative type resist, the organic resist at the irradiated region remains after the development. In the subsequent etching step as shown in FIG. 4D, the organic resist 408 serves as a mask, and the thin film at the portion uncovered with the resist 408 is etched off to form a pattern of the thin film 407.

Figure 4D:
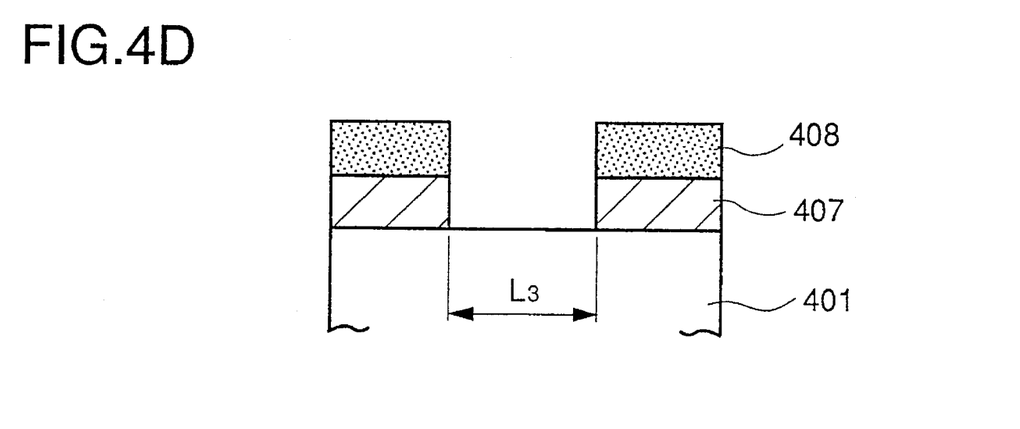

In the conventional process as shown in FIGS. 4A to 4D, the breadth $L_2$ at the development step in FIG. 4C and the breadth $L_3$ at the etching step in FIG. 4D change slightly from the irradiation breadth $L_1$ of the ultraviolet ray or the electron beam 405. Therefore, it is extremely difficult to achieve a sufficiently small final breadth $L_3$, for example, of 0.1 µm or less. In other words, because of the finite thickness of the photosensitive resist 403, the working dimension $L_2$ reflected by sensitivity and developing properties of the organic resist becomes naturally different from $L_1$, and $L_3$ becomes different from $L_2$ since not only the thin film but also the organic resist 408 is etched in the etching step.

As described above, in a conventional lithography, which is widely employed in an ultra LSI process, the finite thickness of the organic resist makes it extremely difficult to achieve the working dimension $L_3$ of 0.1 µm or less.

SUMMARY OF THE INVENTION

An object of the present invention is to solve the problems described above and to provide a process for formating a thin metal film or a thin semiconductor film in a fine breadth, for example, of 0.1 µm or less by deposition.

Another object of the present invention is to provide a process for thin film formation, comprising selectively irradiating with an energy ray a substrate to the surface of which a surface treatment for providing hydrogen atoms is applied to form an irradiated region and a non-irradiated region on the surface of the substrate, and forming a thin film selectively on the non-irradiated region.

In the present invention, the surface treatment is preferably conducted with hydrofluoric acid; the energy ray is preferably an electron beam or an ion beam; the thin film is preferably of a metal such as aluminum; the substrate is preferably a semiconductor substrate or an electroconductive substrate; the thin film is preferably formed by chemical vapor deposition; the chemical vapor deposition may be conducted with an organometallic compound as a starting material; the organometallic compound may be alkylaluminum hydride; and the alkylaluminum hydride may be dimethyl aluminum hydride.

The present invention provides a process utilizing hydrogen atoms in a monoatomic layer thickness as an atomic resist in place of a conventional resist mask pattern in consideration of the fact that the lower limit of the working dimension depends on the thickness of the organic resist.

BRIEF DESCRIPTION OF THE DRAWINGS

FIGS. 2A and 2B are schematic view showing an example of a silicon substrate having aluminum selectively deposited on the surface according to the steps of FIGS. 1A to 1E. In FIGS. 2A and 2B, black portions are the regions which have been irradiated with electron beams, and no aluminum is deposited thereon.

DESCRIPTION OF THE PREFERRED EMBODIMENTS

Preferred embodiments of the present invention are described by reference to the drawings.

FIGS. 1A to 1E show an example of forming only on limited regions an aluminum thin film with a working breadth of 0.1 μm by using terminating hydrogen atoms in a state of monoatomic layer as a mask pattern (hereinafter referred to as an "atomic resist") on the silicon surface. Although the term "mask pattern" or "resist" is used in this example, thin film is selectively formed on the portion to be called the pattern or the resist.

Figure 1A:
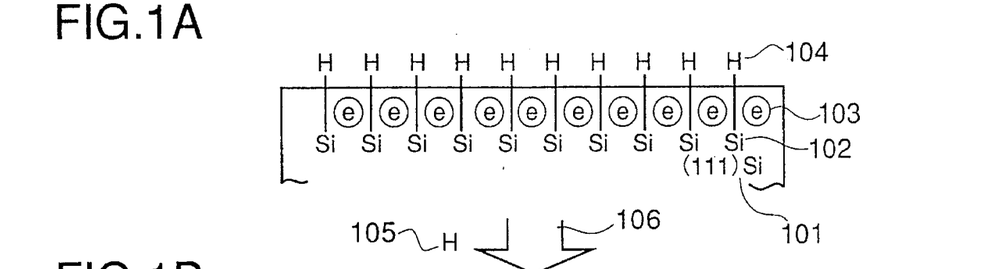
FIGS. 1A to 1E are schematic cross-sectional views showing a substrate in the steps of the thin film formation according to preferred one embodiment of the present invention.

As shown in FIG. 1A, the surface of the (111) Si substrate 101 is made to terminate with hydrogen atoms in a monoatomic layer by chemical treatment or other treatment. In the chemical treatment, for example, the substrate is immersed in a dilute hydrofluoric acid solution (HF/H$_2$O=1/100) and is rinsed with ultrapure water for about 10 minutes. This step of terminating the silicon surface with hydrogen atoms as shown in FIG. 1A corresponds to the resist coating step of FIG. 4A in a conventional resist steps as shown in FIGS. 4A to 4D.

Figure 1B:
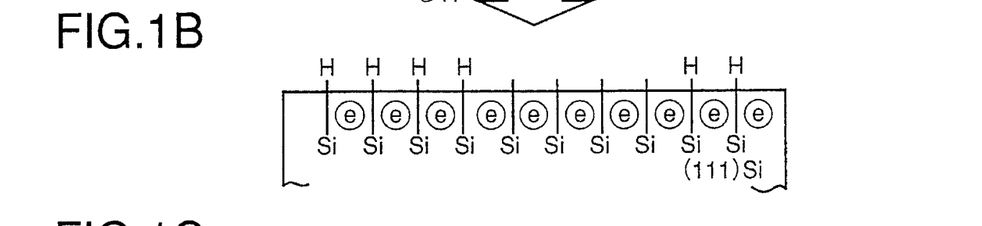

After the step of FIG. 1A, a limited region of the surface of the substrate 101 is irradiated with an energy ray 106 such as an electron beam, an ion beam, a UV light beam or the like (FIG. 1B). By irradiation of an electron beams or an ion beam with energy higher than the Si—H bond energy (reported to be about 3.08 eV), the Si—H bond dissociates and the hydrogen atom 105 is released from the surface of the substrate 101, providing free bonds of silicon atoms on the surface of the silicon substrate. FIG. 1B shows the step of patterning the terminating hydrogen atoms, namely an atomic resist, on the silicon surface. This step corresponds to the light exposure step as shown in FIG. 4B in a conventional resist process.

Figures 1C, 1D:
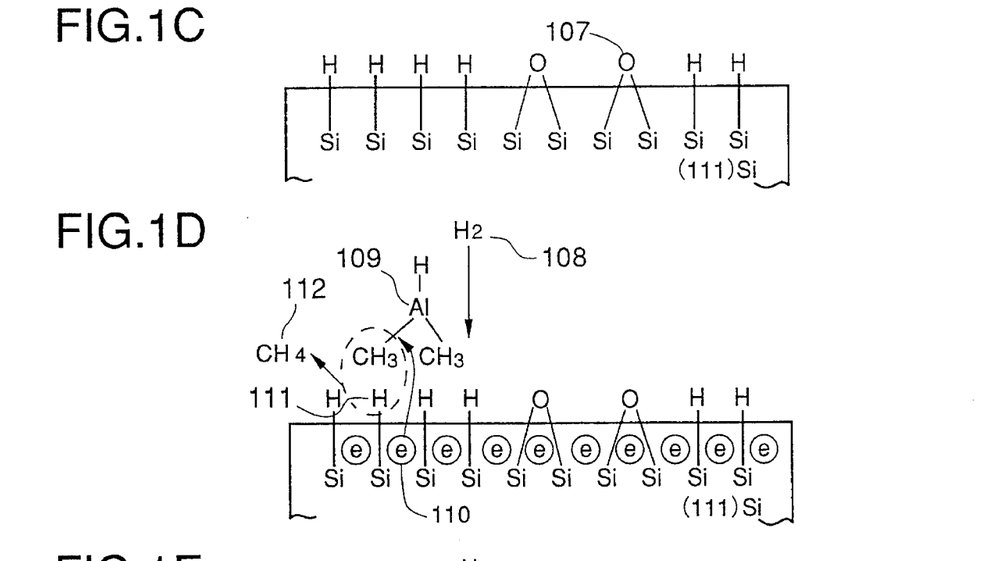

After the step of FIG. 1B, the free bond of the silicon is oxidized, for example, by exposing the substrate 101 in the air to terminate the free bond with an oxygen atom 107 as shown in FIG. 1C. This step of FIG. 1C corresponds to the development step of FIG. 4C in a conventional resist process. The steps of FIG. 1B and FIG. 1C may be practiced sequentially, or otherwise the two steps may be made to proceed simultaneously by using oxygen, ozone, or moisture in the atmosphere at the step of FIG. 1B.

Figure 1E:
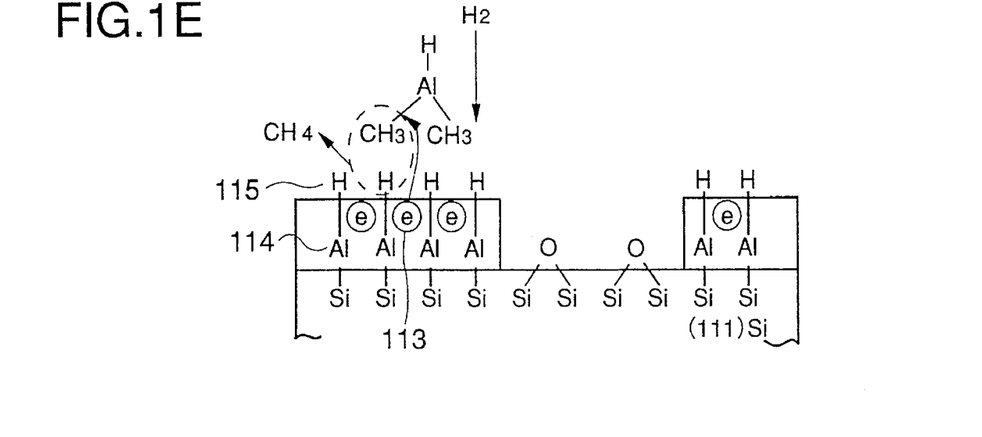

Thereafter, aluminum is deposited in a thin film only on the hydrogen-terminated region of the silicon substrate surface in the steps of FIG. 1D and FIG. 1E.

The aluminum deposition for the above process is preferably conducted by using chemical vapor deposition method, for example, the method disclosed by the present inventors of the present invention in U.S. Pat. No. 5,179,042.

As the starting gaseous materials, an organometal such as dimethylaluminum hydride [(CH$_3$)$_2$AlH, hereinafter referred to as DMAH] and hydrogen (H$_2$). As described in detail in the aforementioned U.S. Patent, monocrystalline aluminum is deposited only on the hydrogen-terminated surface by use of DMAH and H$_2$ at a substrate temperature of from about 200° C. to about 350° C. at a total pressure of from about 0.1 to 5 Torr.

The embodiment of the process shown in FIGS. 1A to 1E is outlined above. The important point of the invention is that the layer of the terminating hydrogen atoms has a thickness of a monoatomic layer. Thereby, the resolution of the working is improved in the thin film formation of the present invention in comparison with the resolution given by conventional organic resists which have a thickness of about 0.1 μm or more. Consequently, as the finest aluminum thin film pattern, an aluminum line of about 100Å in breadth, about 50Å in thickness, and about 1000Å in length can be formed on a surface of a silicon substrate through the steps of FIGS. 1A to 1E.

In the aforementioned U.S. Patent of the present inventors, aluminum thin film formation with DMAH ((CH$_3$)$_2$AlH) and H$_2$ by chemical vapor deposition (CVD) on a silicon wafer which is a substrate having a thermally oxidized SiO$_2$ layer having openings of SiO$_2$ to expose the surface of the silicon is described in detail. Aluminum is selectively deposited only on the SiO$_2$ opening portion by immersing the substrate in a hydrofluoric acid solution (HF/H$_2$O=1:100), rinsing it with pure water, and depositing aluminum by low pressure thermal CVD. In the disclosure, the thickness of insulating material such as SiO$_2$ (non-electrondonative surface described below) is about 500Å or more.

On the other hand, in the present invention, the free bonds of silicon is terminated with oxygen atoms 107 in the step of FIG. 1C. Although the bonding state between oxygen and silicon atoms is not deemed to be simple, as shown in FIG. 1C but may be considered as the oxidized state, the oxidized layer has an extremely small thickness of a monoatomic layer, several atomic layer or thereabout, namely about 3Å to about 20Å. Thus the feature of the present invention resides in that aluminum is selectively patterned by use of terminating hydrogen layer of monoatomic layer thickness and a silicon oxide layer of a single to several atomic layer thickness on a silicon surface.

Naturally, in the steps of FIGS. 1A to 1E, an untreated commercial silicon wafer is used as the substrate, and aluminum thin film is patterned finally as shown in FIG. 1E. In the steps of FIGS. 1A to 1E the conventional organic resist is not used and this is the feature of the present invention.

Figure 5:
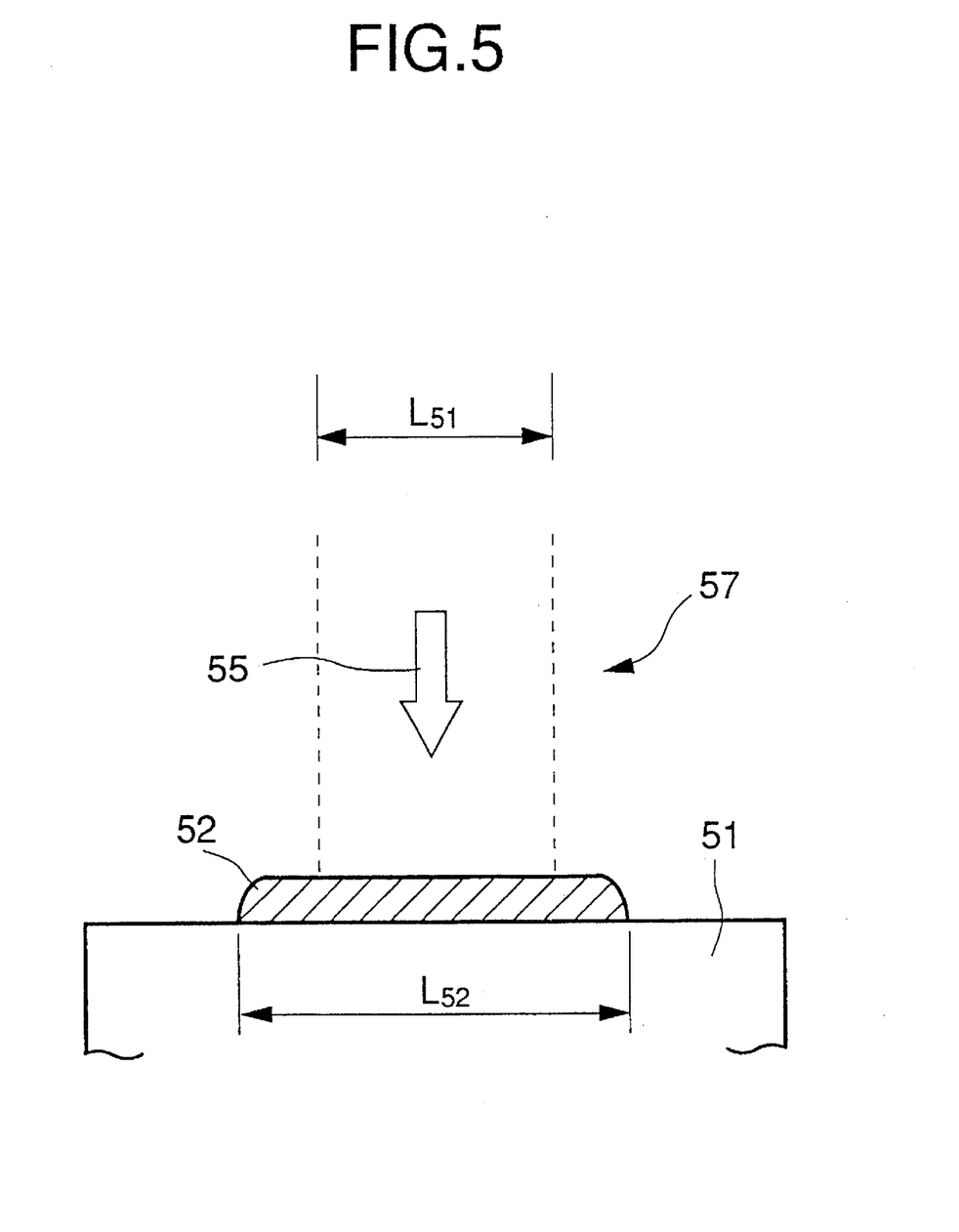
FIG. 5 is a schematic cross-sectional view for explaining conventional thin film formation process by photo-assisted CVD.

In conventional photo-assisted CVD and laser CVD as the thin film formation technique, a desired thin film is deposited on a substrate only at a portion which is irradiated with an energy ray such as light or a laser beam. In such processes, as shown in FIG. 5, for example, a gaseous starting material containing an element for constructing the desired thin film is supplied onto the surface of a substrate 51, and simultaneously only a specified region (the region denoted by L$_{51}$ in FIG. 5) only is irradiated with an energy ray 55 such as ultraviolet light or a laser beam to form a desired thin film 52 only on the irradiated portion. In this process, however, the light-irradiation causes reaction both in the gas phase and on the surface, whereby the region of the actual deposition of the thin film is inevitably larger (as denoted by L$_{52}$ in FIG. 5) than the irradiated region (L$_{51}$). Therefore, it is impossible to deposit a thin film in a breadth of 0.1 μm or less because the gaseous starting material 57 decomposes or reacts by the irradiation in the gas phase into reactive molecular species on the substrate surface and diffuses outside the L$_{51}$ region, and because no means is found to inhibit the reaction of thin film deposition outside the irradiated region ($L_{51}$). In the steps of FIGS. 1A to 1E of the present invention, the patterning regions (the hydrogen-terminated region and the oxygen-terminated region) are clearly distinct and the deposition is caused only by the surface reaction (for example, aluminum deposition from DMAH and $H_2$), whereby the thin film can be deposited in a breadth of 0.1 μm.

The outline and the feature are described above regarding the steps of FIGS. 1A to 1E. The concrete means for this steps is described below in more detail.

The termination with a hydrogen monoatomic layer on the silicon surface in FIG. 1A could be achieved by treatment with a chemical reagent.

A silicon wafer is washed with a known washing solution (e.g., $H_2SO_4+H_2O_2$, and $NH_4OH+H_2O_2+H_2O$), rinsed with pure water, then immersed in dilute HF solution, and rinsed with pure water to terminate the silicon surface with hydrogen atoms in a monoatomic layer. The hydrogen termination of the surface is confirmed by infrared spectrum measurement by means of FT-IR spectrometer or observation with STM. In the rinsing, hot water may be used in place of the pure water for hydrogen termination of the silicon surface.

The important point is that the silicon surface-terminating hydrogen is capable of existing stably for about one to two hours in the atmosphere without forming spontaneous oxidation film. In an ultra-high vacuum, the terminating hydrogen exists stably for about 5 to 10 hours on the silicon surface. The hydrogen atom termination of the silicon surface is well known in the field of the ultra LSI process employing silicon and the field of surface science.

In the pre sent invention, the silicon wafer i s chemically treated by the procedure below:

a) Treatment with a mixed solution of $NH_4OH$, $H_2O_2$, and $H_2O$; water washing (1); treatment with a solution of $HF/H_2O$ (1/100); and water washing (2), or b) Treatment with a solution of $H_2SO_4/H_2O_2$ (4/1); water washing (1); treatment with a solution of $HF/H_2O$ (1/100); and water washing (2).

The aforementioned water washing (2) is preferably conducted for zero to 30 minutes, more preferably for 5 to 15 minutes. The composition of the treating solutions, the washing time and the treatment order may be different from the above in application of the present invention, provided that the silicon surface can be terminated with hydrogen atoms.

In another method of terminating the silicon surface with hydrogen atoms in monoatomic layer thickness, in addition to the above chemical treatment, for example, the silicon is heat-treated at 1000° C. to 1200° C. under ultra-high vacuum at a pressure of $10^{-10}$ Torr or less, and then atomic hydrogen is supplied onto the surface of the silicon to terminate the silicon surface with hydrogen.

The hydrogen monoatomic layer on the silicon surface as described above is the "atomic resist" of the present invention. It may be called an atomic layer resist. Although the atomic layer resist has ideally a thickness of a monoatomic layer, it may has two or more atomic layer thickness, or a monoatomic layer and a plurality of atomic layers may coexist on the wafer surface.

For hydrogen termination of the silicon surface, the procedure of chemical treatment in the atmosphere is simpler and more preferable than the procedure of ultra-high vacuum heat treatment and subsequent atomic hydrogen supply.

FIG. 1A shows the case where the substrate 101 is (111)Si. However, the principle of the process of FIGS. 1A to 1E is not changed in the cases of (100)Si, (110)Si, silicon substrates having other face orientation, and those having an off-angle. In the case.of a substrate having an off-angle, since it has increased step density of atomic levels on the silicon surface, a so-called just substrate having off-angle of about ±0.5° or less gave higher quality of aluminum film obtained from the steps of FIGS. 1A to 1E.

FIG. 1B illustrates a step of patterning of the terminating hydrogen atoms on the silicon surface. An electron beam, an ion beam, ultraviolet light, or the like (106 in FIG. 1B) is irradiated the substrate surface for exposure of the atomic resist. When the energy of the beam 106 is larger than the bond energy of the Si—H bond (reported to be about 3 eV), the Si—H bond dissociates and the hydrogen atom 105 is released from the Si surface to give a free bond of silicon atom. The beam used 106 includes specifically electron beams, ion beams, and ultraviolet rays as mentioned above.

An electron beam formed by accelerating voltage of about 0.5 kV or higher dissociates the hydrogen to realize the steps of FIGS. 1C to 1E. For example, the electron beam could be used which was formed by accelerating voltage of about 25 kV or about 50 kV and had electron beam diameter of from about 80Å to about 1 μm at beam current of from about 5 pA to 5000 pA. The irradiation dose of the electron beam of about $5 \times 10^{15}$ (electrons/cm$^2$) or more enables the practice of the steps of FIGS. 1A to 1E. The irradiation dose of about $1.5 \times 10^{16}$ (electrons/cm$^2$) or more was preferably necessary.

In FIG. 1B, the electron beam is projected to irradiate simultaneously the region on which elimination of the terminating hydrogen atoms is desired to be caused. The electron beam may be projected simultaneously in a desired pattern as shown in FIG. 1B, or may be allowed to scan the desired portion in a fine beam form. In this irradiation, the substrate is not heated with special heating means. The terminating hydrogen on the silicon substrate is reported to be released at about 410° C. at an Si—H site, and at about 535° C. at an Si—$H_2$ site (Liehr et al.: Ext. Abs. of the 22nd (1990) International Conference on Solid State Devices and Materials, Sendai, 1990, pp. 1099–1112).

In the step of FIG. 1B, when the substrate was irradiated with the electron beam 106 or the like while heating, the terminating hydrogen could be released by a small irradiation dose of electron beam in comparison with the case at a room temperature. For example, when the step of FIG. 1B was conducted by using the substrate heated to about 200° C. and irradiating with an electron beam of 25 kV and 0.6 μm in diameter in a dose of $1 \times 10^{-13}$ electrons/cm$^2$, an aluminum thin film was formed only at the non-irradiated portion through the steps of FIGS. 1C to 1E.

When the step of FIG. 1A is conducted by chemical treatment and the step of FIG. 1B is conducted by electron beam irradiation, the substrate 101 may be delivered through the air to the apparatus for the step of FIG. 1B. For example, when a commercial electron beam exposure system is employed in the step of FIG. 1B, the substrate 101 after the step of FIG. 1A is transported through the air to the exposure chamber (kept at a vacuum) of the electron beam exposure system. When the degree of vacuum in the vacuum chamber for irradiating with the electron beam was a pressure of about $1 \times 10^{-4}$ Torr or lower, there is no trouble in the steps of FIGS. 1A to 1E. If the substrate 101 is heated at the electron beam irradiation, the degree of vacuum is preferably a pressure of $1 \times 10^{-6}$ Torr or lower. At the pressure of $1 \times 10^{-6}$ Torr or higher, aluminum is not deposited onto the portion irradiated with an electron beam in the steps of FIGS. 1A to 1E, but aluminum is deposited onto the non-irradiated portion. However, at the pressure, the quality of the deposited aluminum film was poor. For example, in the step of FIG. 1B, when the electron beam irradiation was conducted at 200° C. at a pressure of $1\times10^{-6}$ Torr or lower (e.g., $1\times10^{-7}$ Torr) [Step A], or at 200° C. at a pressure of $1\times10^{-6}$ Torr or higher (e.g., $1\times10^{-5}$ Torr) [Step B], and the steps of FIGS. 1A, 1C, 1D, and 1E are conducted in the same manner respectively, the formed aluminum thin film in Step A was monocrystalline, but the formed aluminum thin film in Step B was poor in the surface morphology and the half width value of the rocking curve of X-ray diffraction was unsatisfactory although the aluminum thin film was monocrystalline.

As the beam 106 (energy ray) useful in the step of FIG. 1B, ion beams of such as $O_2^+$, $O^-$, $N_2^+$, $Ar^+$, and the like can be used in addition to the above electron beam. Further, ion beams of Xe, Kr, He, Ne, etc. may be used. In the case where an $O_2^+$ ion beam was used, an aluminum thin film could be selectively formed on the non-irradiated region by eliminating the surface hydrogen on the silicone substrate 101 at the accelerating voltage of not lower than about 0.5 kV and treating the substrate through the steps of FIGS. 1C to 1E. The accelerating voltage was preferably not lower than 3 kV. The irradiation dose of the $O_2^+$ ion beam was not less than about $1\times10^{13}$ ions/cm$^2$. If the substrate 101 was heated on irradiation of the $O_2^+$ ion beam, the required dose of the ion beam irradiation for the surface hydrogen elimination was about $5\times10^{11}$ ions/cm$^2$ or more. By irradiation of the $O_2^+$ ion beam, hydrogen atoms at the irradiated portion are eliminated as shown in FIG. 1B, and the surface silicon atoms after the elimination of the hydrogen atoms are terminated with oxygen as shown in FIG. 1C. In the cases where another kind of ion beam, such as ion beams of $Ar^+$, $He^+$, $Ne^+$, $Kr^+$, and $N_2^+$ is irradiated, the hydrogen atoms are eliminated as shown in FIG. 1B to form only free bonds of silicon in the absence of oxygen or moisture in the atmosphere similarly as in the case of an electron beam.

In the step of FIG. 1B, ultraviolet light of wavelength of 4000Å or less could be also used. For example, an i-line stepper (wavelength: 365 nm), a commercial projection aligner, is useful. Excimer laser steppers employing KrF (wavelength: 248 nm) or ArF (wavelength: 193 nm) could be also useful. Further, SOR light (synchrotron radiation light) could be used.

After the treatment of FIG. 1B, the substrate 101 is exposed to the air, as shown in FIG. 1C, to bond oxygen atoms to the surface silicon atoms at the sites from which the terminating hydrogen atoms have been eliminated. The layer bonding with the oxygen atoms has also an extremely thin, that is, monoatomic layer thickness or several atomic layer thickness. Thus, a hydrogen-terminated region and an oxygen-terminated region are formed in the steps of FIGS. 1B to 1C. The steps shown in FIGS. 1A to 1E provides terminating hydrogens as the resist in a monoatomic layer thickness. Therefore the resolution at the substrate surface is in an atomic size level.

In the step of FIG. 1C, the substrate 101 may be exposed to an atmosphere of oxygen or ozone in place of the air. Otherwise, the steps of FIG. 1B and FIG. 1C may be practiced in one step by irradiation of an electron beam or an ion beam in vacuum where oxygen or ozone is introduced.

In the steps of FIG. 1B, introduction of a chlorine type gas or a fluorine type gas such as $Cl_2$, $CCl_4$, and $CF_4$ into the vacuum enables decrease of the required dose of the ion beam irradiation or electron beam irradiation for elimination of the terminating hydrogen atoms.

In the steps of FIG. 1D and FIG. 1E, aluminum is deposited only onto the hydrogen-terminated portion of the substrate having been treated in the step of FIG. 1C.

A preferred method for aluminum deposition is the chemical vapor deposition method by use of DMAH (($CH_3)_2$AlH) and $H_2$ which have been disclosed by the inventors of the present invention in the aforementioned U.S. Pat. No. 5,179,042. In the chemical vapor deposition method using DMAH 109 and $H_2$ 108 as described in this U.S. patent in detail, the reaction of aluminum deposition on silicon depends on the following three factors: (1) catalytic contribution of the free electrons 110 existing on the surface to the surface reaction, (2) the terminating hydrogen 111 on the silicon surface, and (3) formation of methane ($CH_4$) by the selective reaction of the terminating hydrogen 111 on the surface and the methyl group ($CH_3$ group) in the DMAH molecule. As shown in FIGS. 1D and 1E, aluminum 114 is deposited on the hydrogen terminated surface where all of the aforementioned three factors are satisfied. After the aluminum deposition, hydrogen atoms (H) of the DMAH come to exist as the terminating hydrogen 115. Since the aluminum has free electrons 113, the steps of FIGS. 1D and 1E proceed spontaneously.

Aluminum deposition reaction does not occur in the region to terminated with hydrogen atom, for example, in the region where the electron beam 106 has been irradiated since the terminating hydrogen on the surface is absent.

The aluminum-deposition region is considered below. The aluminum deposition reaction from DMAH and $H_2$ gives incessantly terminating hydrogen atoms on the aluminum surface. Therefore, the aluminum deposition in the steps of FIGS. 1D and 1E does not tend to spread to the oxygen-terminated region, so that aluminum deposits only onto the hydrogen-terminated surface even when the oxygen-terminated surface is in monoatomic thickness or several atomic thickness.

Since the terminating hydrogen atoms on the silicon surface arrange regularly, the aluminum film formed on the hydrogen terminated region given by the steps of FIGS. 1A to 1E is monocrystalline as described in the aforementioned U.S. Patent.

In the steps of FIGS. 1D and 1E, the preferred conditions of aluminum deposition are the total pressure of from about $10^{-3}$ Torr to about 760 Torr, the DMAH partial pressure of from about $1.5\times10^{-5}$ times to about $1\times10^{-2}$ times the total pressure, and the deposition temperature of from about 200° C. to about 450° C.: more preferably, the total pressure of from about 0.1 Torr to about 5 Torr, the DMAH partial pressure of from $1\times10^{-3}$ times of $1.5\times10^{-3}$ times the total pressure, and the deposition temperature of from about 200° C. to about 350° C.

As the gaseous starting materials, MMAH (($CH_3$)AlH$_2$) and $H_2$ may be used in place of the above DMAH and $H_2$. DMAH and MMAH may be used in combination. Since the vapor pressure of MMAH is undesirably low, DMAH is preferably used. Furthermore, if $SiH_4$, $Si_2H_6$, $SiHCl_3$, $SiH_2Cl_2$, $SiH_3Cl$, or $SiCl_4$ is fed simultaneously with the gaseous aluminum compound, Al—Si containing silicon at a concentration of from about $10^{-3}\%$ to about 2% can be formed only on the hydrogen-terminated surface.

The procedure for the deposition steps of FIGS. 1D and 1E is described below in more detail.

Figure 3:
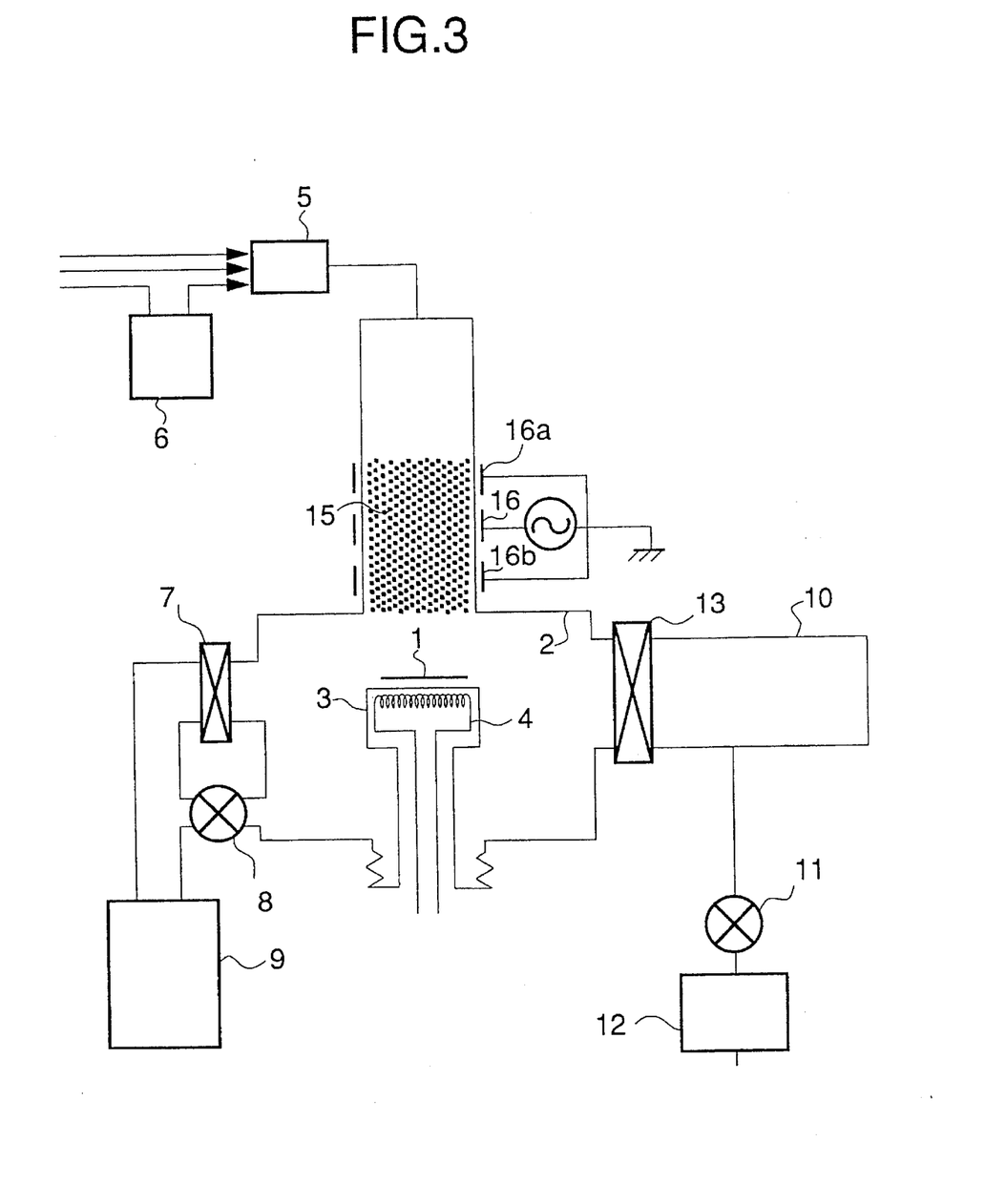
FIG. 3 is a block diagram illustrating an aluminum deposition apparatus which can be preferably used in the present invention.

FIG. 3 illustrates schematically an example of deposition film forming system which is applicable to the film forming process of the present invention.

A substrate 1 is a substrate for forming an Al film or an Al—Si film. The substrate 1 is placed on a substrate holder 3 provided inside the reaction tube 2 which constitutes a substantially closed space for the deposition film formation. The reaction tube 2 is preferably made of quartz, but may be made of a metal. If the reaction tube is made of a metal, the reaction tube is desirably cooled. The substrate holder 3 is made of a metal, and is provided with a heater 4 for heating the substrate placed thereon. The temperature of the substrate is controlled by controlling the heating temperature of the heater 4.

The gas supplying system is constituted as below. A gas mixer 5 mixes a first starting material gas with a second starting material gas, and supplies the resulting gaseous mixture to the reaction tube 2. The starting material gas evaporator 6 evaporates an organoaluminum compound as the first starting material gas. Since the organometallic compound used in the present invention is liquid at room temperature, a carrier gas is passed through the liquid organometal compound to form saturated vapor thereof, and the saturated vapor is introduced into the gas mixer 5.

The evacuation system is constituted as below. A gate valve 7 is opened when a large quantity of evacuation is to be conducted, for example, at the time of evacuation of the reaction tube 2 before the deposition film formation. A slow leak valve 8 is opened when a small quantity of evacuation is to be conducted, for example, for controlling the internal pressure of the reaction tube 2 during the deposition film formation. An evacuation unit 9 comprises an evacuation pump such as a turbo molecular pump.

The delivery system for the substrate 1 is constituted as below. The substrate before and after the deposition film formation is kept in the substrate delivery chamber 10. The substrate delivery chamber is evacuated by opening the valve 11 which is connected to an evacuation unit 12 comprising an evacuation pump such as a turbo molecular pump. The valve 13 is opened only when the substrate 1 is transferred between the reaction chamber and a delivery space.

On the periphery of the reaction tube 2, electrodes 16, 16a and 16b are provided as plasma generation means capable of generating plasma. An AC power source 14 is connected thereto.

As shown in FIG. 3, in the starting material vaporizer (gas-forming chamber) 6 for forming the first starting material gas, hydrogen, argon or another inert gas is bubbled as a carrier gas into liquid DMAH kept at room temperature to form gaseous DMAH. The resulting gaseous DMAH is introduced to the mixer 5. Hydrogen as the other gaseous reactant is introduced to the mixer 5 through another route. The flow rates of the gases are controlled respectively so as to maintain the partial pressures at desired level.

The first starting material gas may be $MMAH_2$. However, DMAH is more preferable as it readily gives the vapor pressure of 1 Torr. DMAH and $MMAH_2$ may be used in combination.

The silicon-containing gas as a second starting material gas for forming an Al—Si film includes $Si_2H_6$, $SiH_4$, $Si_3H_8$, $Si(CH_3)_4$, $SiCl_4$, $SiH_2Cl_2$, and $SiH_3Cl$. Of these, $Si_2H_6$ is the most suitable which is decomposable at a low temperature of 200° to 300° C. $Si_2H_6$ or the like diluted with hydrogen or argon is introduced to the mixer 5 through a route different from that of the DMAH, and then to the reaction tube 2.

A gaseous mixture containing DMAH and $H_2$ for depositing Al, or a gaseous mixture containing DMAH, $Si_2H_6$ and $H_2$ for depositing Al—Si is supplied onto a substrate 1 heated at the decomposition temperature or higher of DMAH but not higher than 450° C. Thereby Al or Al—Si deposits only on the hydrogen-terminated portion to form a continuous film of Al or Al—Si as shown in FIG. 2B.

The temperature of the substrate during the deposition is desirably at a temperature of not lower than the decomposition temperature of the aluminum-containing starting material gas and not higher than 450° C. as mentioned above. Specifically, the substrate temperature is preferably in the range of from 200° to 450° C. Under such a temperature condition, aluminum is deposited on the hydrogen-terminated surface at an internal pressure of the reaction vessel of from $10^{-3}$ Torr to 760 Torr and a partial pressure of DMAH of from $1.6 \times 10^{-5}$ times to $1.3 \times 10^{-3}$ times the internal pressure of the reaction vessel. More preferably, at a temperature of from 200° C. to 350° C. at a total pressure of from 0.01 Torr to 5 Torr, monocrystalline aluminum without carbon could be deposited only on the hydrogen-terminated portion.

The procedure of the steps of FIGS. 1A to 1E are described above.

In the step of FIG. 1B, the terminating hydrogen on the silicon surface may be eliminated by means of an STM tip by one atom or several atoms of hydrogen. When STM is employed, it is preferred to use two or more STM tips to increase the number of the hydrogen atoms to be eliminated simultaneously. With the present level of the technique, an electron beam can readily scanned electrically.

With the present level of the technique, the electron beam can readily be narrowed to about. 80Å, so that an electron beam is preferably used for forming aluminum lines or aluminum lines and spaces at a breadth of 0.1 μm or less. An $O_2^+$ or $Ar^+$ ion beam of about 1 μm in beam diameter could form aluminum lines and space in a dimension of about 1.5 μm.

The influence of the atmosphere in FIGS. 1A to 1E was investigated. The terminating hydrogen atoms in FIG. 1A is formed by chemical treatment in the air. The treated substrate is delivered through the air, and then an electron beam is projected thereon in vacuo in an electron beam exposure system. The substrate was delivered again through the air, and aluminum was deposited thereon by means of a CVD apparatus. Even when the substrate is delivered several times through the air, aluminum is deposited only on the hydrogen-terminated surface. This is the feature of the present invention. Naturally, all of the steps may be practiced in vacuum or in a nitrogen atmosphere without the air, or the step of FIG. 1C may be practiced in an oxygen or ozone atmosphere in the absence of the air. The present invention enables formation of aluminum lines in a dimension of 0.1 μm or less, about 100Å, by using the terminating hydrogen in monoatomic layer thickness on the surface and by such a simple manner of delivering in the air. This is the great feature of the present invention.

The selective aluminum growth on the silicon surface by use of DMAH and hydrogen depends on the following three factors: (1) catalytic action of free electron on the surface towards the surface reaction (that is use of electron-donative substrate having free electrons capable of contributing the surface reaction), (2) terminating hydrogen atoms on the silicon surface, and (3) formation of methane ($CH_4$) from the selective reaction of the terminating hydrogen on the surface with the methyl group ($CH_3$ group).

The present invention provides a process for forming fine aluminum pattern on a silicon surface, and proves at the same time the above-described formation mechanism experimentally.

The present invention is described below in more detail with the Examples, but the invention is not limited by the Examples.

For facilitating the understanding of the examples, the outline of the Examples is shown prior to the description of the respective Examples.

Outline of Examples

Example 1: Basic example employing electron beam,

Example 2: Washing time of Example 1 was changed,

Example 3: Dose of electron beam irradiation of Example 1 was changed,,

Example 4: Electron beam was irradiated while the substrate was being heated in Example 3, Example 5: Oxygen and ozone were used as electron beam irradiation atmosphere in Example 1, Example 6: Deposition conditions of Example 1 was changed, Example 7: Material of the substrate of Examples 1 to 6 was changed, Example 8: Hydrogen termination was conducted by heating in ultrahigh vacuum and feeding of atomic hydrogen in Examples 1 to 7;

Example 9: Example employing electron beam (other than $O_2$ ion),

Example 10: Washing time of Example 9 was changed,

Example 11: Dose of electron beam irradiation of Example 9 was changed,

Example 12: Electron beam was irradiated while the substrate was being heated in Example 11, Example 13: Oxygen and ozone were used as electron beam irradiation atmosphere in Example 9, Example 14: Deposition conditions of Example 9 was changed, Example 15: Material of the substrate of Examples 9 to 14 was changed, Example 16: Hydrogen termination was conducted by heating in ultra-high vacuum and feeding of atomic hydrogen in Examples 9 to 15, Example 17: Example employing electron beam ($O_2$ ion), Example 18: Washing time of Example 17 was changed, Example 19: Dose of electron beam irradiation of Example 17 was changed, Example 20: Electron beam was irradiated while the substrate was being heated in Example 19, Example 21: Deposition conditions of Example 17 was changed, Example 22: Material of the substrate of Examples 17 to 21 was changed, and Example 23: Hydrogen termination was conducted by heating in ultrahigh vacuum and feeding of atomic hydrogen in Examples 17 to 22.

EXAMPLE 1

In the steps of FIGS. 1A to 1E, aluminum was deposited on a silicon substrate under the following conditions.

The substrate was n-type (111)Si having a resistivity of 1 to 2 Ωcm.

The surface of the silicon substrate was terminated with hydrogen as shown in FIG. 1A by chemical treatment according to the procedure as shown in (1) to (4) below:

(1) Washing with a mixture of $H_2SO_4:H_5O_2$ (1:4), (2) Rinsing with pure water, (3) Immersion in a mixture of $HF:H_2O$ (1:100) for 1 minute, and (4) Rinsing with pure water for 10 minutes.

Then the substrate was delivered through the air, and a portion of the substrate surface was irradiated with an electron beam in vacuo. The accelerating voltage of the electron beam was 25 kV, and the dose of the electron beam irradiation was $5\times10^{17}$ electrons/cm².

After the electron beam irradiation, the substrate was delivered through the air to an aluminum deposition apparatus. Hydrogen and DMAH [$(CH_3)_2AlH$] were used as the starting materials. Aluminum was deposited under the conditions of the total pressure of 1.2 Torr, the DMAH partial pressure of $1\times10^{-3}$ times the total pressure, the deposition temperature of 270° C., and the deposition time of about 5 minutes.

Figure 2A:
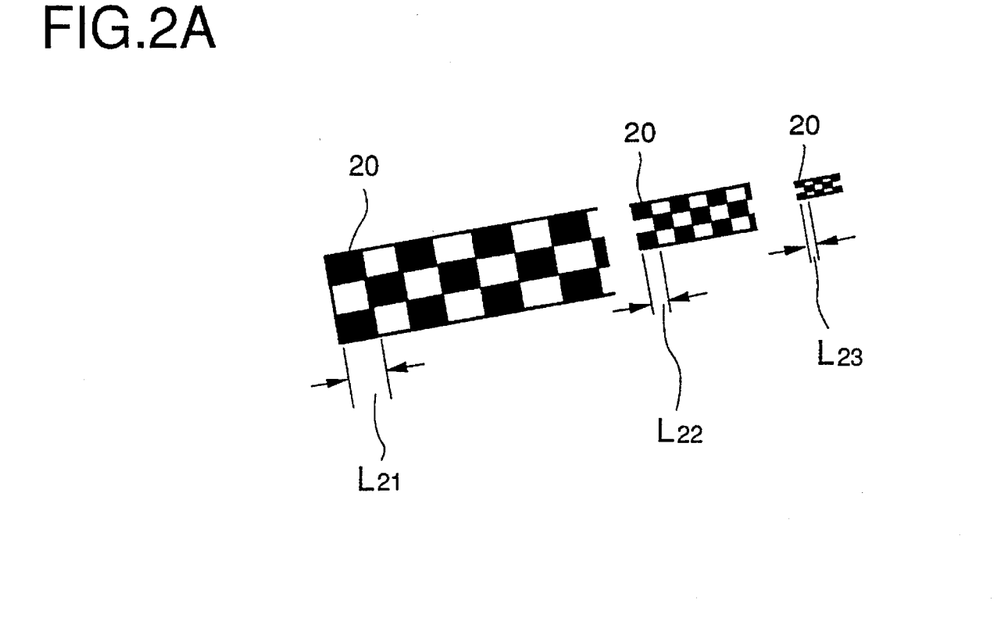
Figure 2B:
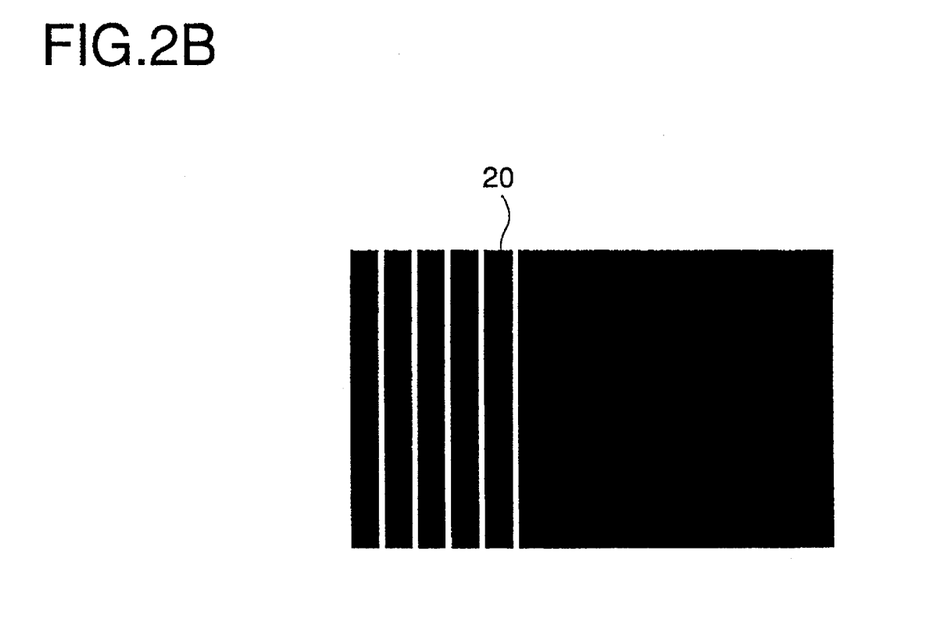

FIGS. 2A and 2B illustrate schematically the microphotograph of the aluminum surface. FIG. 2A illustrates a block pattern and FIG. 2B illustrates a line-and-space pattern. The black portion 20 is a region irradiated with the electron beam and is not deposited with aluminum thereon. On the white portion, aluminum is deposited. Thereby, it was clearly confirmed that aluminum does not deposit on the electron beam-irradiated portion, but deposits on the non-irradiated portion. In FIG. 2A, $L_{21}$ is about 2 µm long, $L_{22}$ is about 1 µm long, and $L_{23}$ is about 0.5 µm, and the aluminum non-deposited regions are formed in a similar shape.

The composition of the aluminum film was evaluated by photoelectron spectroscopy, and it was found that the contents of carbon and oxygen was below the detection limit (0.1% for the employed apparatus). The crystallinity of the aluminum film was evaluated by X-ray diffraction and RHEED (reflection high energy electron diffraction), and it was found that the film was monocrystalline (100) aluminum.

EXAMPLE 2

The procedure was the same as in Example 1 except that the time of rinsing with pure water was 0 minute, one minute, 5 minutes, 10 minutes, 20 minutes and 60 minutes after the immersion [(3): Immersion in a mixture of $HF:H_2O$ (1:100) for 1 minute] in the step of FIG. 1A.

In any of the above cases, aluminum did not deposit on the portion which was irradiated with the electron beam, and deposited on the portion which was not irradiated with the electron beam as in Example 1. However, the quality of deposited aluminum films was not the same although every aluminum films was monocrystal in any cases. As the result of evaluation of half-width value of rocking curve by X-ray diffraction, the aluminum film of the case of 10-minute water washing exhibited the smallest half-width value of the rocking curve and had high crystallinity. The smallest half-width value was about 0.2° which is approximate to the lower detection limit of half-width of the employed apparatus.

EXAMPLE 3

The procedure was the same as in Example 1 except that the acceleration voltage and the irradiation dose of the electron beam were changed. The acceleration voltage of the electron beam was adjusted to 1 kV, 5 kV, 10 kV, 25 kV, or 50 kV. The dose of the electron beam irradiation was:

$1\times10^{12}$ electrons/cm², $5\times10^{12}$ electrons/cm², $1\times10^{13}$ electrons/cm², $5\times10^{13}$ electrons/cm², $1\times10^{14}$ electrons/cm², $5\times10^{14}$ electrons/cm², $1\times10^{15}$ electrons/cm², $5\times10^{15}$ electrons/cm², $1\times10^{16}$ electrons/cm², $1.5\times10^{16}$ electrons/cm², $3\times10^{16}$ electrons/cm², $5\times10^{16}$ electrons/cm², $1\times10^{17}$ electrons/cm², $5\times10^{17}$ electrons/cm², or $1\times10^{18}$ electrons/cm².

Irrespective of the acceleration voltage, the results below were obtained.

At the electron beam irradiation of about $5\times10^{15}$ electrons/cm$^2$ or more, aluminum did not deposit on the irradiated region, and deposited on the non-irradiated region as in Example 1. At the electron beam irradiation dose of not less than about $1\times10^{15}$ electrons/cm$^2$ but not more than about $3\times10^{16}$ electrons/cm$^2$, although aluminum did not deposit on the irradiated region, formation of aluminum nuclei was observed thereon by electron microscopy. At the electron beam irradiation of not less than about $3\times10^{16}$ electrons/cm$^2$, formation of aluminum nuclei was not observed.

EXAMPLE 4

The procedure was the same as in Example 3 except that the heating temperature condition of substrate heating was "no heating", 100° C., 200° C. 300° C., 400° C., or 450° C.

In order to distinctly differentiate the aluminum deposition at the irradiated portion from that at the non-irradiated portion as shown in FIGS. 2A and 2B, more than a certain dose of electron beam has to be irradiated as shown in Example 3. This dose is called the critical electron beam irradiation dose. In Example 3, the critical electron beam irradiation dose was about $5\times10^{15}$ electrons/cm$^2$ or more.

When the electron beam was irradiated with heating of the substrate, the critical electron beam irradiation dose became lower.

In the electron beam irradiation at the substrate temperature of 200° C., the critical electron beam irradiation dose was about $1\times10^{13}$ electrons/cm$^2$.

At the substrate temperature of 400° C., the critical electron beam irradiation dose was about $1\times10^{13}$ electrons/cm$^2$, and the quality of the aluminum film deposited on the non-irradiated portion deteriorated: the half-width value of the rocking curve of X-ray decreased even when the aluminum was monocrystalline, and in some cases, the aluminum was polycrystalline.

In the electron beam irradiation at the substrate temperature of 450° C. although aluminum is to be naturally deposited on the non-irradiated portion at this temperature, aluminum was deposited in a nucleus state and did not deposited in some portion. This is considered to be due to the fact that the hydrogen on the surface of the silicon was eliminated on heating and an oxide layer was formed on exposure to the air.

EXAMPLE 5

The electron beam was made to irradiate while introducing oxygen or ozone in this Example, while in Example 1 and Example 3 the electron beam was made to irradiate in vacuo. After the irradiation, the substrate was transferred to the aluminum deposition apparatus without exposing the substrate to the air, and aluminum was deposited thereon. Specifically, during the transfer, the substrate was kept in a vacuum box or in vessel filled with high-purity nitrogen. The moisture in the high-purity nitrogen corresponded to the dew point of $-90°$ C.

The degree of vacuum in the electron beam irradiation space was a pressure of about $1\times10^{-7}$ Torr or less before the introduction of oxygen or ozone. The oxygen or ozone was introduced to give a pressure of about $1\times10^{-5}$ Torr. The acceleration voltage of the electron beam was adjusted to 1 kV, 5 kV, 10 kV, 25 kV, or 50 kV. The quantity of the electron beam irradiation was:

$1\times10^{12}$ electrons/cm$^2$, $5\times10^{12}$ electrons/cm$^2$,
$1\times10^{13}$ electrons/cm$^2$, $5\times10^{13}$ electrons/cm$^2$,
$1\times10^{14}$ electrons/cm$^2$, $5\times10^{14}$ electrons/cm$^2$,
$1\times10^{15}$ electrons/cm$^2$, $5\times10^{15}$ electrons/cm$^2$,
$1\times10^{16}$ electrons/cm$^2$, $1.5\times10^{16}$ electrons/cm$^2$,
$3\times10^{16}$ electrons/cm$^2$, $5\times10^{16}$ electrons/cm$^2$,
$1\times10^{17}$ electrons/cm$^2$, $5\times10^{17}$ electrons/cm$^2$, or
$1\times10^{18}$ electrons/cm$^2$.

Irrespectively of the acceleration voltage and the introduced gas (oxygen or ozone in this Example), the results below were obtained.

At the electron beam irradiation dose of about $5\times10^{15}$ electrons/cm$^2$ or more, aluminum did not deposit on the irradiated region, and deposited on the non-irradiated region as in Example 1. At the electron beam irradiation dose of not less than about $1\times10^{15}$ electrons/cm$^2$ but not more than about $3\times10^{16}$ electrons/cm$^2$, formation of aluminum nuclei was observed thereon by electron microscopy although aluminum did not deposit on the irradiated region. At the electron beam irradiation dose of not less than about $3\times10^{16}$ electrons/cm$^2$ formation of aluminum nuclei was not observed in the irradiated region.

EXAMPLE 6

The procedure was the same as in Example 1 except that the aluminum deposition conditions were changed.

At the deposition temperature of 270° C., with the total pressure changed in the range of from 0.01 Torr to 10 Torr, aluminum did not deposit on the electron beam-irradiated region, but deposited on the non-irradiated region, similarly as in Example 1.

At the total pressure of 1.5 Torr, and at the deposition temperature of 200° C., 230° C., 270° C., 300° C., 350° C., 450° C. or 470° C., aluminum did not deposit on the electron beam-irradiated region, but deposited on the non-irradiated region. At 470° C., however, the resulting aluminum film is contaminated with carbon. The half-width of the X-ray rocking curve took the least value in the aluminum film deposited at about 230° C. to 350° C.

EXAMPLE 7

The same experiments were conducted as in Examples 1 to 6 except that the substrates used were silicon wafers shown below.
(Conductive type)
  n-type, and p-type,
(Resistivity)
  0.01 Ωcm, 1 Ωcm, 10 Ωcm, and 100 Ωcm
  (These resistivity values are nominal values shown by the supplier.)
(Face orientation)
  (100) Si, (110) Si, (111) Si,
  (100)Si tilting to <011> direction by 4°,
  (100)Si tilting to <001> direction by 4°, and
  (111)Si tilting to <011> direction by 4°,
  The accuracy of the face orientation was ±0.5°.

Aluminum was deposited on the 48 kinds of silicon wafers (combinations of 2 conductive types×4 kinds of resistivity×6 types of face orientation). The results were the same as in Example 1 to 6.

However, a difference was observed in the initial growth process between the n-type substrate and the p-type substrate. For example, at 270° C. by visual observation, after the DMAH supply, aluminum deposition was confirmed, with the n-type substrate, in one or two minutes, while with the p-type substrate, aluminum deposition was confirmed in about 2 to 3 minutes.

EXAMPLE 8

In the above Examples 1–7, hydrogen termination of the silicon surface was conducted by chemical treatment. On the contrary, in this Example, the hydrogen termination of the silicon surface was conducted by heating the substrate in ultra-high vacuum and supplying atomic hydrogen thereto.

The silicon substrate was washed by repeating the steps (1) and (2) below three times, and then delivered to the vacuum vessel.

(1) Washing with a mixture of $H_2SO_4:H_2O_2$ (1:4), and (2) Rinsing with pure water.

In a vacuum vessel capable of giving a final pressure of $1\times10^{-10}$ Torr or lower, the silicon substrate was heated up to 1000° C. or 1200° C. Then the substrate was cooled to about 50° C. and atomic hydrogens were supplied onto the surface of the substrate. The degree of vacuum in the vacuum vessel, when atomic hydrogens were introduced, was about $1\times10^{-6}$ Torr.

After the above steps, the experiment was conducted in the same manner as in Examples 1–7.

Consequently similar results as in Examples 1–7 were obtained.

EXAMPLE 9

In the steps of FIGS. 1A to 1E, aluminum was deposited on a silicon substrate under the conditions below.

The substrate was n-type (111)Si having a resistivity of 1 to 2 Ωcm.

The surface of the silicon substrate was terminated with hydrogen as shown in FIG. 1A by chemical treatment according to the procedure as shown in (1) to (4) below:

(1) Washing with a mixture of $H_2SO_4:H_2O_2$ (1:4), (2) Rinsing with pure water, (3) Immersion in a mixture of $HF:H_2O$ (1:100) for 1 minute, and (4) Rinsing with pure water for 10 minutes.

Then the substrate was delivered through the air, and a portion of the substrate surface was irradiated with an ion beam of $Ar^+$, $N_2$, Xe, Kr, or Ne in vacuo. The accelerating voltage of the ion beam was 10 kV, and the dose of the ion beam irradiation was $5\times10^{14}$ ions/cm$^2$.

After the ion beam irradiation, the substrate was delivered through the air to an aluminum deposition apparatus. Hydrogen and DMAH [$(CH_3)_2AlH$] were used as the starting materials. Aluminum was deposited under the conditions of the total pressure of 1.2 Torr, the DMAH partial pressure of $1\times10^{-3}$ times the total pressure, the deposition temperature of 270° C., and the deposition time of about 5 minutes.

The results were the same as in Example 1: aluminum did not deposit on the ion-beam-irradiated region, but deposited on the non-irradiated region.

The composition of the aluminum film was evaluated by photoelectron spectroscopy, and it was found that the contents of carbon and oxygen was below the detection limit (0.1% for the employed apparatus). The crystallinity of the aluminum film was evaluated by X-ray diffraction and RHEED (reflection high energy electron diffraction), and it was found that the film was monocrystalline (100) aluminum.

EXAMPLE 10

The procedure was the same as in Example 9 except that the time of rinsing with pure water was 0 minute, one minute, 5 minutes, 10 minutes, 20 minutes and 60 minutes after the immersion [(3): Immersion in a mixture of $HF:H_2O$ (1:100) for 1 minute] in the step of FIG. 1A, similarly as in Example 2.

In any of the above cases, aluminum did not deposit on the portion which had been irradiated with the ion beam, but deposited on the portion which had not been irradiated with the ion beam similarly as in Example 9. However, the quality of deposited aluminum film was not the same although all aluminum films were monocrystals in any case. As the result of evaluation by X-ray diffraction, the aluminum film of the case of 10-minute water washing exhibited the smallest half-width value of the rocking curve and high crystallinity. The smallest half-width value was about 0.2° which is approximate to the lower detection limit of half-width of the employed apparatus.

EXAMPLE 11

The procedure was the same as in Example 9 except that the acceleration voltage and the irradiation dose of the ion beam were changed in the step of FIG. 1B. The acceleration voltage of the ion beam was adjusted to 1 kV, 5 kV, or 10 kV. The dose of the ion beam irradiation was:

$1\times10^{11}$ ions/cm$^2$, $5\times10^{11}$ ions/cm$^2$, $1\times10^{12}$ ions/cm$^2$, $5\times10^{12}$ ions/cm$^2$, $1\times10^{13}$ ions/cm$^2$, $5\times10^{13}$ ions/cm$^2$, $1\times10^{14}$ ions/cm$^2$, $5\times10^{14}$ ions/cm$^2$, $1\times10^{15}$ ions/cm$^2$, $5\times10^{15}$ ions/cm$^2$, $1\times10^{16}$ ions/cm$^2$, $5\times10^{16}$ ions/cm$^2$, $1\times10^{17}$ ions/cm$^2$, $5\times10^{17}$ ions/cm$^2$, or $1\times10^{18}$ ions/cm$^2$.

Irrespective of the acceleration voltage, the results below were obtained.

At the ion beam irradiation dose of about $1\times10^{14}$ ions/cm$^2$ or more, aluminum did not deposit on the irradiated region, and deposited on the non-irradiated region similarly as in Example 1.

EXAMPLE 12

This Example was carried out under the condition that the temperature condition for substrate heating was "no heating", 100° C., 200° C., 300° C., 400° C. or 450° C., In order to distinctly differentiate the aluminum deposition at the irradiated portion from that at the non-irradiated portion as shown in FIGS. 2A and 2B, more than a certain dose of ion beam has to be irradiated as shown in Example 11. This dose is called the critical ion beam irradiation dose. In Example 11, the critical ion beam irradiation dose was about $1\times10^{14}$ ions/cm$^2$ or more.

When the ion beam was irradiated with heating of the substrate, the critical ion beam irradiation dose became lower.

In the ion beam irradiation at the substrate temperature of 200° C., the critical ion beam irradiation dose was about $5\times10^{12}$ ions/cm$^2$.

At the substrate temperature of 400° C., the critical ion beam irradiation dose was about $5\times10^{12}$ ions/cm$^2$, and the quality of the aluminum film deposited on the non-irradiated portion deteriorated: the half-width value of the rocking curve of X-ray decreased even when the aluminum was monocrystalline, and in some cases, the aluminum was polycrystalline.

In the ion beam irradiation at the substrate temperature of 450° C., although aluminum is to be naturally deposited on the non-irradiated portion at this temperature, aluminum was deposited in a nucleus state and did not deposited in some portion. This is considered to be due to the fact that the hydrogen on the surface of the silicon was eliminated on heating and an oxide layer was formed on exposure to the air.

EXAMPLE 13

The ion beam was made to irradiated while introducing oxygen or ozone in this Example, while in Example 9 and Example 11 the ion beam was made to irradiate in vacuo. After the irradiation, the substrate was transferred to the aluminum deposition apparatus without exposing the substrate to the air, and aluminum was deposited thereon. Specifically, during the transfer, the substrate was kept in a vacuum box or in a vessel filled high-purity nitrogen. The moisture in the high-purity nitrogen corresponded to the dew point of −90° C.

The degree of vacuum in the ion beam irradiation space was a pressure of about $1\times10^{-7}$ Torr or less before the introduction of oxygen or ozone. The oxygen or ozone was introduced to give a pressure of about $1\times10^{-5}$ Torr. The acceleration voltage of the ion beam was adjusted to 1 kV, 5 kV, 10 kV, 25 kV, or 50 kV. The quantity of the ion beam irradiation was:

$1\times10^{11}$ ions/cm$^2$, $5\times10^{11}$ ions/cm$^2$,
$1\times10^{12}$ ions/cm$^2$, $5\times10^{12}$ ions/cm$^2$,
$1\times10^{13}$ ions/cm$^2$, $5\times10^{13}$ ions/cm$^2$,
$1\times10^{14}$ ions/cm$^2$, $5\times10^{14}$ ions/cm$^2$,
$1\times10^{15}$ ions/cm$^2$, $5\times10^{15}$ ions/cm$^2$,
$1\times10^{16}$ ions/cm$^2$, $5\times10^{16}$ ions/cm$^2$,
$1\times10^{17}$ ions/cm$^2$, $5\times10^{17}$ ions/cm$^2$, or
$1\times10^{18}$ ions/cm$^2$.

Irrespective of the acceleration voltage and the introduced gas (oxygen or ozone in this Example), at the ion beam irradiation dose of about $5\times10^{14}$ ions/cm$^2$ or more, aluminum did not deposit on the irradiated region, and deposited on the non-irradiated region similarly as in Example 9.

EXAMPLE 14

The procedure was the same as in Example 9 except that the aluminum deposition conditions were changed.

At the deposition temperature of 270° C., with the total pressure changed in the range of from 0.01 Torr to 10 Torr, aluminum did not deposit on the ion beam-irradiated region, but deposited on the non-irradiated region, similarly as in Example 9.

At the total pressure of 1.5 Torr, and at the deposition temperature of 200° C., 230° C., 270° C., 300° C. 350° C., 450° C., or 470° C., aluminum did not deposit on the ion beam-irradiated region, but deposited on the non-irradiated region. At 470° C., however, the resulting aluminum film is contaminated with carbon. The half-width of the X-ray rocking curve took the least value in the aluminum film deposited at about 230° C. to 350° C.

EXAMPLE 15

The same experiments were conducted as in Examples 9 to 14 except that the substrates used were silicon wafers shown below.
(Conductive type )
  n-type, and p-type,
(Resistivity)
  0.01 Ωcm, 1 Ωcm, 10 Ωcm, and 100 Ωcm
  (These resistivity Values are nominal values shown by the supplier. )
(Face orientation)
  (100)Si, (110)Si, (111)Si,
  (100)Si tilting to <011> direction by 4°,
  (100)Si tilting to <001> direction by 4° and
  (111)Si tilting to <011> direction by 4°.
The accuracy of the face orientation was ±0.5°.

Aluminum was deposited on the 48 kinds of silicon wafers (combinations of 2 conductive types×kinds of resistivity×6 types of face orientation). The results were the same as in Example 9 to 14.

However, a difference was observed in the initial growth process between the n-type substrate and the p-type substrate. For example at 270° C. by visual observation, aluminum deposition was confirmed, with the n-type substrate, in one or two minutes after the DMAH supply, while with the p-type substrate, aluminum deposition was confirmed in about 2 to 3 minutes.

EXAMPLE 16

In the above Examples 9–15, hydrogen termination of the silicon surface was conducted by chemical treatment. On the contrary, in this Example, the hydrogen termination of the silicon surface was conducted by heating the substrate in ultra-high vacuum and supplying atomic hydrogen thereto. The silicon substrate was washed by repeating the steps (1) and (2) below three times, and then delivered to the vacuum vessel.

(1) Washing with a mixture of H$_2$SO$_4$:H$_2$O$_2$ (1:4), and (2) Rinsing with pure water.

In a vacuum vessel capable of giving a final pressure of $1\times10^{-10}$ Torr or lower, the silicon substrate was heated up to 1000° C. or 1200° C. Then the substrate was cooled to about 50° C. and atomic hydrogens were supplied onto the surface of the substrate. The degree of vacuum in the vacuum vessel, when atomic hydrogens were introduced, was about $1\times10^{-6}$ Torr.

After the above steps, the experiment was conducted in the same manner as in Examples 9–15.

Consequently similar results as in Examples 9–15 were obtained.

EXAMPLE 17

In the steps of FIGS. 1A to 1E, aluminum is deposited on a silicon substrate under the conditions below.

The substrate was of n-type (111)Si having a resistivity of 1 to 2 Ωcm.

The surface of the silicon substrate was terminated with hydrogen as shown in FIG. 1A by chemical treatment according to the procedure as shown in (1) to (4) below:

(1) Washing with a mixture of H$_2$SO$_4$:H$_2$O$_2$ (1:4), (2) Rinsing with pure water, (3) Immersion in a mixture of HF:H$_2$O (1:100) for 1 minute, and (4) Rinsing with pure water for 10 minutes.

Then the substrate was delivered through the air, and a portion of the substrate surface was irradiated with an ion beam of O$_2{}^+$, or O$^-$ in vacuo. The accelerating voltage of the ion beam was 10 kV, and the dose of the ion beam irradiation was 1×10$^{14}$ ions/cm$^2$.

After the ion beam irradiation, the substrate was delivered through the air to an aluminum deposition apparatus. Hydrogen and DMAH [(CH$_3$)$_2$AlH] were used as the starting materials. Aluminum was deposited under the conditions of the total pressure of 1.2 Torr, the DMAH partial pressure of 1×10$^{-3}$ times the total pressure, the deposition temperature of 270° C., and the deposition time of about 5 minutes.

The results were the same as in Example 1: aluminum did not deposit on the ion-beam-irradiated region, and aluminum deposited on the non-irradiated region.

The composition of the aluminum film was evaluated by photoelectron spectroscopy, and it was found that the contents of carbon and oxygen was below the detection limit (0.1% for the employed apparatus). The crystallinity of the aluminum film was evaluated by X-ray diffraction and RHEED (reflection high energy electron diffraction), and it was found that the film was monocrystalline (100) aluminum.

When the substrate was delivered without exposing to the air after the O$_2{}^+$ ion beam or the O$^-$ ion beam to the aluminum depositing apparatus, the results were the same as the results with exposure to the air.

EXAMPLE 18

The procedure was the same as in Example 17 except that the time of rinsing with pure water was 0 minute, one minute, 5 minutes, 10 minutes, 20 minutes and 60 minutes after the immersion [(3): Immersion in a mixture of HF:H$_2$O (1:100) for 1 minute] in the step of FIG. 1A, similarly as in Example 2.

In any of the above cases, aluminum did not deposit on the portion which had been irradiated with the O$_2{}^+$ ion beam or the O$^-$ ion beam, and deposited on the portion which had not been irradiated with the ion beam similarly as in Example 9. However, the quality of deposited aluminum film was not the same although all aluminum films were monocrystals. As the result of evaluation by X-ray diffraction, the aluminum film of the case of 10-minute water washing exhibited the smallest half-width value of the rocking curve and had high crystallinity. The smallest half-width value was about 0.2° which is approximate to the lower detection limit of half-width of the employed apparatus.

EXAMPLE 19

The procedure was the same as in Example 17 except that the acceleration voltage and the irradiation dose of the ion beam were changed in the step of FIG. 1B. The acceleration voltage of the O$_2{}^+$ ion beam or the O$^-$ ion beam was adjusted to 1 kV, 5 kV, or 10 kV. The dose of the ion beam irradiation was:

1×10$^{11}$ ions/cm$^2$, 5×10$^{11}$ ions/cm$^2$,

1×10$^{12}$ ions/cm$^2$, 5×10$^{12}$ ions/cm$^2$,

1×10$^{13}$ ions/cm$^2$, 5×10$^{13}$ ions/cm$^2$,

1×10$^{14}$ ions/cm$^2$, 5×10$^{14}$ ions/cm$^2$,

1×10$^{15}$ ions/cm$^2$, 5×10$^{15}$ ions/cm$^2$,

1×10$^{16}$ ions/cm$^2$, 5×10$^{16}$ ions/cm$^2$,

1×10$^{17}$ ions/cm$^2$, 5×10$^{17}$ ions/cm$^2$, or

1×10$^{18}$ ions/cm$^2$.

Irrespective of the acceleration voltage, the results below were obtained.

At the ion beam irradiation dose of about 5×10$^{13}$ ions/cm$^2$ or more, aluminum did not deposit on the irradiated region, but deposited on the non-irradiated region similarly as in Example 17.

EXAMPLE 20

The procedure was the same as in Example 17 except that the temperature condition for substrate heating was "no heating", 100° C., 200° C., 300° C., 400° C., or 450° C.

In order to differentiate distinctly the aluminum deposition at the irradiated portion from that at the non-irradiated portion as shown in FIGS. 2A and 2B, more than a certain dose of ion beam has to be irradiated as shown in Example 19. This dose is called the critical ion beam irradiation dose. In Example 19, the critical ion beam irradiation dose was about 5×10$^{13}$ ions/cm$^2$ or more.

When the ion beam was irradiated with heating of the substrate, the critical ion beam irradiation do se became lower.

In the ion beam irradiation at the substrate temperature of 200° C., the critical ion beam irradiation dose was about 1×10$^{12}$ ions/cm$^2$.

At the substrate temperature of 400° C., the critical ion beam irradiation dose was about 1×10$^{12}$ ions/cm$^2$ and the quality of the aluminum film deposited on the non-irradiated portion deteriorated: the half-width value of the rocking curve of X-ray decreased even when the aluminum was monocrystalline, and in some cases, the aluminum was polycrystalline.

In the ion beam irradiation at the substrate temperature of 450° C., although aluminum is to be naturally deposited on the non-irradiated portion at this temperature, aluminum was deposited in a nucleus state and did not deposit in some portion. This is considered to be due to the fact that the hydrogen on the surface of the silicon was eliminated on heating and an oxide layer was formed on exposure to the air.

EXAMPLE 21

The procedure was the same as in Example 17 except that the aluminum deposition conditions were changed.

At the deposition temperature of 270° C., with the total pressure changed in the range of from 0.01 Torr to 10 Torr, aluminum did not deposit on the ion beam-irradiated region, but deposited on the non-irradiated region, as in Example 17.

At the total pressure of 1.5 Torr, and at the deposition temperature of 200° C., 230° C., 270° C., 300° C., 350° C., 450° C., or 470° C., aluminum did not deposit on the ion beam-irradiated region, but deposited on the non-irradiated region. At 470° C., however, the resulting aluminum film is contaminated with carbon. The half-width of the X-ray rocking curve took the least value in the aluminum film deposited at about 230° C. to 350° C.

EXAMPLE 22

The same experiments were conducted as in Examples 17 to 21 except that the substrates used were silicon wafers shown below.

(Conductive type)

n-type, and p-type, (Resistivity)

0.01 Ωcm, 1 Ωcm, 10 Ωcm, and 100 Ωcm (These resistivity values are nominal values shown by the supplier.)

(Face orientation)

(100)Si, (110)Si, (111)Si, (100)Si tilting to <011> direction by 4°, (100)Si tilting to <001> direction by 4°, and (111)Si tilting to <011> direction by 4°, The accuracy of the face orientation was ±0.5°.

Aluminum was deposited on the 48 kinds of silicon wafers (combinations of 2 conductive types×4 kinds of resistivity×6 types of face orientation). The results were the same as in Example 17 to 21.

However, difference was observed in the initial growth process between the n-type substrate and the p-type substrate. For example at 270° C. by visual observation, aluminum deposition was confirmed, with the n-type substrate, in one or two minutes after the DMAH supply, while with the p-type substrate, aluminum deposition was confirmed in about 2 to 3 minutes.

EXAMPLE 23

In the above Examples 17–22, hydrogen termination of the silicon surface was conducted by chemical treatment. On the contrary, in this Example, the hydrogen termination of the silicon surface was conducted by heating the substrate in ultra-high vacuum and supplying atomic hydrogen thereto. The silicon substrate was washed by repeating the steps (1) and (2) below three times, and then delivered to the vacuum vessel.

(1) Washing with a mixture of $H_2SO_4$:$H_2O_2$ (1:4), and (2) Rinsing with pure water.

In a vacuum vessel capable of giving a final pressure of $1 \times 10^{-10}$ Torr or lower, the silicon substrate was heated up to 1000° C. or 1200° C. Then the substrate was cooled to about 50° C. and atomic hydrogens were supplied onto the surface of the substrate. The vacuum degree in the vacuum vessel, when atomic hydrogens were introduced, was about $1 \times 10^{-6}$ Torr.

After the above steps, the experiment was conducted in the same manner as in Examples 17–22.

Consequently similar results as in Examples 17–22 were obtained.

As described above, the present invention provides a process for thin film formation, comprising the steps of treating a surface of a substrate to terminate the surface with hydrogen atoms, selectively irradiating with energy ray a substrate to the surface of which a surface treatment for providing hydrogen atoms is applied to thereby form an irradiated region and a non-irradiated region on the surface of the substrate, and forming a thin film selectively on the non-irradiated region. Thereby the present invention enables deposition of a thin metal film or a thin semiconductor film in a fine breadth, for example, of 0.1 μm or less. The surface treatment can simply be conducted with hydrofluoric acid. By use of an electron beam or an ion beam as the energy ray, the hydrogen atoms are efficiently eliminated.

What is claimed is:

1. A process for forming a thin film on a substrate, which comprises the steps:

(a) treating a surface of the substrate to provide hydrogen atoms thereon;

(b) selectively irradiating the surface with an energy beam to form an irradiated region and a non-irradiated region on the surface;

(c) subjecting the surface to an oxidizing atmosphere to oxidize the irradiated region; and (d) selectively forming a thin film on the non-irradiated region by chemical vapor deposition, wherein the chemical vapor deposition is conducted with alkylaluminumhydride and hydrogen.

2. The process according to claim 1, wherein the energy beam is an oxygen ion beam.

3. The process according to claim 1, wherein the steps (b) and (c) are performed by conducting irradiation of the energy beam in an oxidizing atmosphere.

4. The process according to claim 1, wherein the oxidizing atmosphere comprises at least one selected from oxygen, ozone and moisture in the atmosphere.

5. A process for thin film formation according to claim 1, wherein the surface treatment is carried out with hydrofluoric acid.

6. A process for thin film formation according to claim 1, wherein the energy beam is an electron beam or an ion beam.

7. A process for thin film formation according to claim 1, wherein the substrate is a semiconductor substrate.

8. A process for thin film formation according to claim 1, wherein the alkylaluminum hydride is dimethylaluminum hydride.

* * * * *

UNITED STATES PATENT AND TRADEMARK OFFICE
CERTIFICATE OF CORRECTION

PATENT NO. : 5,604,153
DATED : February 18, 1997
INVENTOR(S) : KAZUO TSUBOUCHI ET AL.

Page 1 of 3

It is certified that error appears in the above-identified patent and that said Letters Patent is hereby corrected as shown below:

On the title page,

AT [56] REFERENCES CITED

Other Publications,
"XPSMeasurement" should read --XPS Measurement--.

COLUMN 4

Line 26, "is" should read --are--.

COLUMN 5

Line 32, "pre sent" should read --present-- and
"i s" should read --is--.

COLUMN 7

Line 51, "provides" should read --provide--.

COLUMN 8

Line 33, "thickness." should read --thicknesses.--.

COLUMN 11

Line 10, "was" should read --were--.
Line 26, "was" should read --were--.
Line 39, "was" should read --were--.
Line 57, "$H_sO_2$" should read --$H_2O_2$--.

UNITED STATES PATENT AND TRADEMARK OFFICE
CERTIFICATE OF CORRECTION

PATENT NO. : 5,604,153
DATED : February 18, 1997
INVENTOR(S) : KAZUO TSUBOUCHI ET AL.

It is certified that error appears in the above-identified patent and that said Letters Patent is hereby corrected as shown below:

COLUMN 12

Line 22, "was" should read --were--.
Line 42, "films" should read --film-- and "cases." should read --case.--.

COLUMN 16

Line 53, "450°C.," should read --450°C., similarly as in Example 3.--.

COLUMN 17

Line 11, "deposited" should read --deposit--.
Line 19, "irradiated" should read --irradiate--.

COLUMN 18

Line 46, "1x10'$^{10}$Torr" should read --1x10$^{-10}$Torr--.

COLUMN 20

Line 25, "do se" should read --dose--.

UNITED STATES PATENT AND TRADEMARK OFFICE
CERTIFICATE OF CORRECTION

PATENT NO. : 5,604,153
DATED : February 18, 1997
INVENTOR(S) : KAZUO TSUBOUCHI ET AL.

It is certified that error appears in the above-identified patent and that said Letters Patent is hereby corrected as shown below:

COLUMN 22

Line 28, "minumhydride" should read --minum hydride--.

Signed and Sealed this

Seventh Day of October, 1997

Attest:

BRUCE LEHMAN

Attesting Officer        Commissioner of Patents and Trademarks